United States Patent
Li

(10) Patent No.: US 9,209,387 B2
(45) Date of Patent: Dec. 8, 2015

(54) PHASE CHANGE MEMORY AND FABRICATION METHOD

(71) Applicants: Semiconductor Manufacturing International (Shanghai) Corporation, Shanghai (CN); Shanghai Institute of Microsystem and Information Technology, Chinese Academy of Science, Shaghai (CN)

(72) Inventor: Ying Li, Shanghai (CN)

(73) Assignees: SEMICONDUCTOR MANUFACTURING INTERNATIONAL (SHANGHAI) CORPORATION, Shanghai (CN); SHANGHAI INSTITUTE OF MICROSYSTEM AND INFORMATION TECHNOLOGY, CHINESE ACADEMY OF SCIENCE, Shanghai (CN)

( * ) Notice: Subject to any disclaimer, the term of this patent is extended or adjusted under 35 U.S.C. 154(b) by 0 days.

(21) Appl. No.: 14/494,321

(22) Filed: Sep. 23, 2014

(65) Prior Publication Data

US 2015/0090954 A1    Apr. 2, 2015

(30) Foreign Application Priority Data

Sep. 29, 2013    (CN) .......................... 2013 1 0460164

(51) Int. Cl.
*H01L 45/00*    (2006.01)

(52) U.S. Cl.
CPC .............. *H01L 45/06* (2013.01); *H01L 45/126* (2013.01); *H01L 45/1233* (2013.01); *H01L 45/144* (2013.01); *H01L 45/1683* (2013.01)

(58) Field of Classification Search
CPC ... H01L 45/06; H01L 45/1233; H01L 45/141; H01L 45/1691
USPC .......................................................... 257/2
See application file for complete search history.

(56) References Cited

U.S. PATENT DOCUMENTS

| 7,321,130 B2 * | 1/2008 | Lung et al. .......................... 257/4 |
| 7,547,913 B2 * | 6/2009 | Yoon et al. ....................... 257/42 |
| 7,939,815 B2 * | 5/2011 | Lee et al. .......................... 257/2 |

* cited by examiner

*Primary Examiner* — Mark Prenty
(74) *Attorney, Agent, or Firm* — Anova Law Group, PLLC

(57) ABSTRACT

A phase change memory and its fabrication method are provided. A bottom electrode structure is provided through a substrate. A mask layer is formed on the substrate and the bottom electrode structure. A first opening is formed in the mask layer to expose the bottom electrode structure. A spacer is formed on sidewalls and bottom surface portions of the first opening to expose a surface portion of the bottom electrode structure. The first opening including the spacer therein has a bottom width less than a top width. A heating layer is formed at least on the surface portion of the bottom electrode structure exposed by the spacer. A phase change layer is formed on the heating layer to completely fill the first opening. A top electrode is formed on the phase change layer and the mask layer.

19 Claims, 8 Drawing Sheets

PHASE CHANGE MEMORY AND FABRICATION METHOD

CROSS-REFERENCES TO RELATED APPLICATIONS

This application claims the priority to Chinese Patent Application No. CN201310460164.8, filed on Sep. 29, 2013, which is incorporated herein by reference in its entirety.

FIELD OF THE DISCLOSURE

The present disclosure generally relates to the field of semiconductor technology and, more particularly, relates to a phase change memory and a method of forming the same.

BACKGROUND

Technology of phase change random access memory (PCRAM) is developed from a conception proposed by S. R. Ovshinsky at the end of 1960s that phase change thin film can find applications in phase change storage media. As a recently-emerged non-volatile memory technology, phase change memory (PCM) has advantages over flash memory in many aspects, including read/write speed, read/write times, data retention time, cell area, multiple values, etc. Currently, PCM has become a research focus in the non-volatile memory technology.

A PCM value can be changed by heat treatment of a data-stored phase change layer in a PCM. Phase change materials constituting the phase change layer can be changed into a crystalline state or an amorphous state due to the heating effect by an applied electric current. When the phase change layer is in a crystalline state, PCRAM has a low electrical resistance and the value of memory is assigned to be 0. When the phase change layer is in an amorphous state, PCRAM has a high electrical resistance and the value of memory is assigned to be 1. Hence, PCRAM is a non-volatile memory that can write/read data through an electrical resistance difference of the phase change layer in a crystalline state or an amorphous state.

Conventionally, a bottom contact electrode having a small size can usually be placed between a lower electrode of PCM and the phase change layer to enhance efficiency of PCM. However, the fabrication processes for a conventional PCM are complicated and costly.

BRIEF SUMMARY OF THE DISCLOSURE

One aspect of the present disclosure includes a method for fabricating a phase change memory. A substrate containing a bottom electrode structure through the substrate is provided. The bottom electrode structure has a top surface flushed with a top surface of the substrate. A mask layer is formed on the flushed top surfaces of the substrate and the bottom electrode structure. A first opening is formed in the mask layer to expose the top surface of the bottom electrode structure. A spacer is formed on sidewalls and bottom surface portions of the first opening to expose a surface portion of the bottom electrode structure. The first opening including the spacer therein has a width at a bottom of the first opening less than a width at a top of the first opening. A heating layer is formed at least on the surface portion of the bottom electrode structure exposed by the spacer, the heating layer having a top surface lower than a top surface of the mask layer. A phase change layer is formed on the heating layer to completely fill the first opening. A top electrode is formed on the phase change layer and the mask layer.

Another aspect of the present disclosure includes a phase change memory (PCM). The PCM includes a substrate, a bottom electrode structure, a mask layer, a spacer, a heating layer, a phase change layer, and a top electrode. The bottom electrode structure disposed through the substrate, the bottom electrode structure having a top surface flushed with a top surface of the substrate. The mask layer is disposed on the flushed top surfaces of the substrate and the bottom electrode. The mask layer includes a first opening in the mask layer to expose the top surface of the bottom electrode structure. The spacer is disposed on sidewalls and bottom surface portions of the first opening to expose a surface portion of the bottom electrode structure. The first opening including the spacer therein has a width at a bottom of the first opening less than a width at a top of the first opening. The heating layer is disposed at least on the surface portion of the bottom electrode structure exposed by the spacer, the heating layer having a top surface lower than a top surface of the mask layer. The phase change layer is disposed on the heating layer to completely fill the first opening. The top electrode is disposed on the phase change layer and the mask layer.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
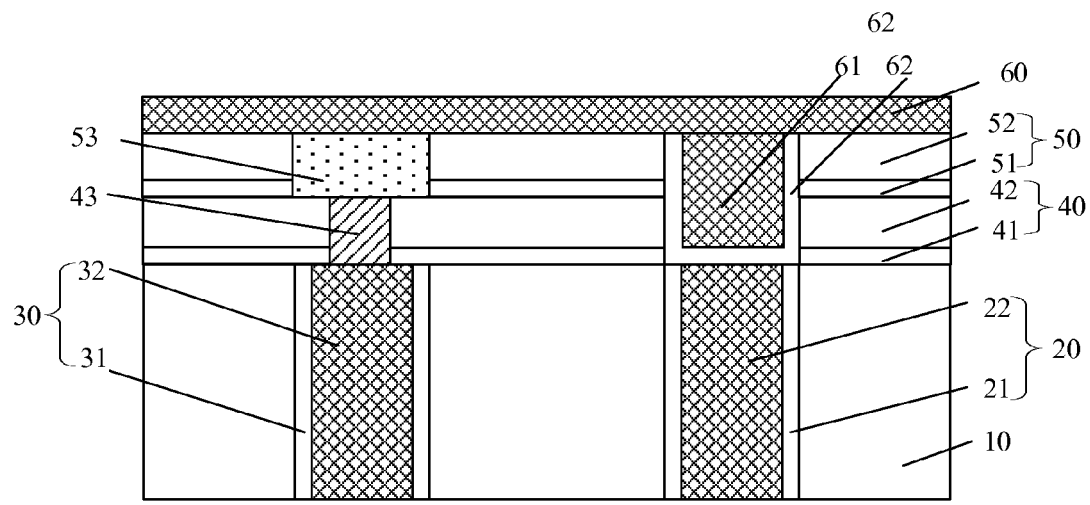
FIG. 1 depicts a conventional phase change memory.

Conventional processes for forming a PCM (i.e., phase change memory) are complicated and costly. FIG. 1 depicts a conventional PCM. A formation process for such conventional PCM can include providing a substrate 10 and forming a peripheral metal interconnect structure 20 and a bottom electrode 30 in the substrate 10. The peripheral metal interconnect structure 20 includes an interconnect metal layer 22 and an interconnect adhesive layer 21. The bottom electrode 30 includes a bottom electrode metal layer 32 and a bottom electrode adhesive layer 31. A first mask layer 40 covers the substrate 10. The first mask layer 40 includes a first silicon nitride layer 41 and a first silicon oxide layer 42. A first opening in the first mask layer 40 exposes a surface portion of the bottom electrode metal layer 32. A bottom contact electrode 43 is formed in the first opening. A second mask layer 50 is formed on the surface of the first mask layer 40. The second mask layer includes a second silicon nitride layer 51 and a second silicon oxide layer 52. A second opening is formed in the second mask layer 50 to expose the surface of the bottom contact electrode 43. A phase change layer 53 is formed in the second opening. The second mask layer 50 and the first mask layer 40 are etched to form a third opening exposing the surface of the peripheral metal interconnect structure 20. A metal layer 62 is formed in the third opening and includes a metal material layer 61 and a metal adhesive layer 62. A top electrode 60 covers the second mask layer 50, the phase change layer 53, and the metal layer 62.

The method for fabricating the above conventional PCM needs at least three times of exposure and etching to form a first opening, a second opening, and a third opening, respectively. The process steps are complicated and costly. Further, when etching to form the third opening, more material layers need to be etched and the formed third opening has a great depth, which can easily cause errors to occur in etching pattern. Additionally, due to the great depth of the third opening, difficulty can increase for subsequently forming a metal layer in the third opening, thus affecting PCM performance.

Accordingly, disclosed herein includes a method for fabricating a PCM. The disclosed methods can use a decreased number of etching processes using a mask to lower process cost for fabricating the PCM.

Figure 15:
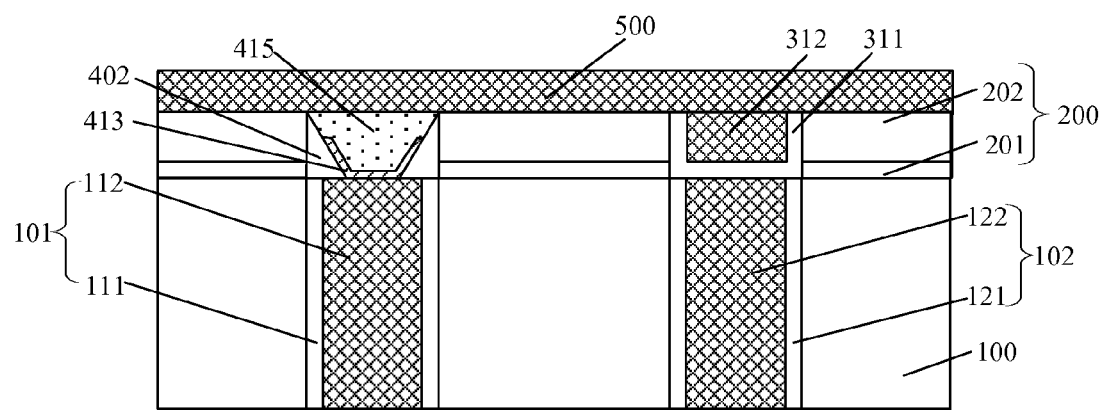
Figure 16:
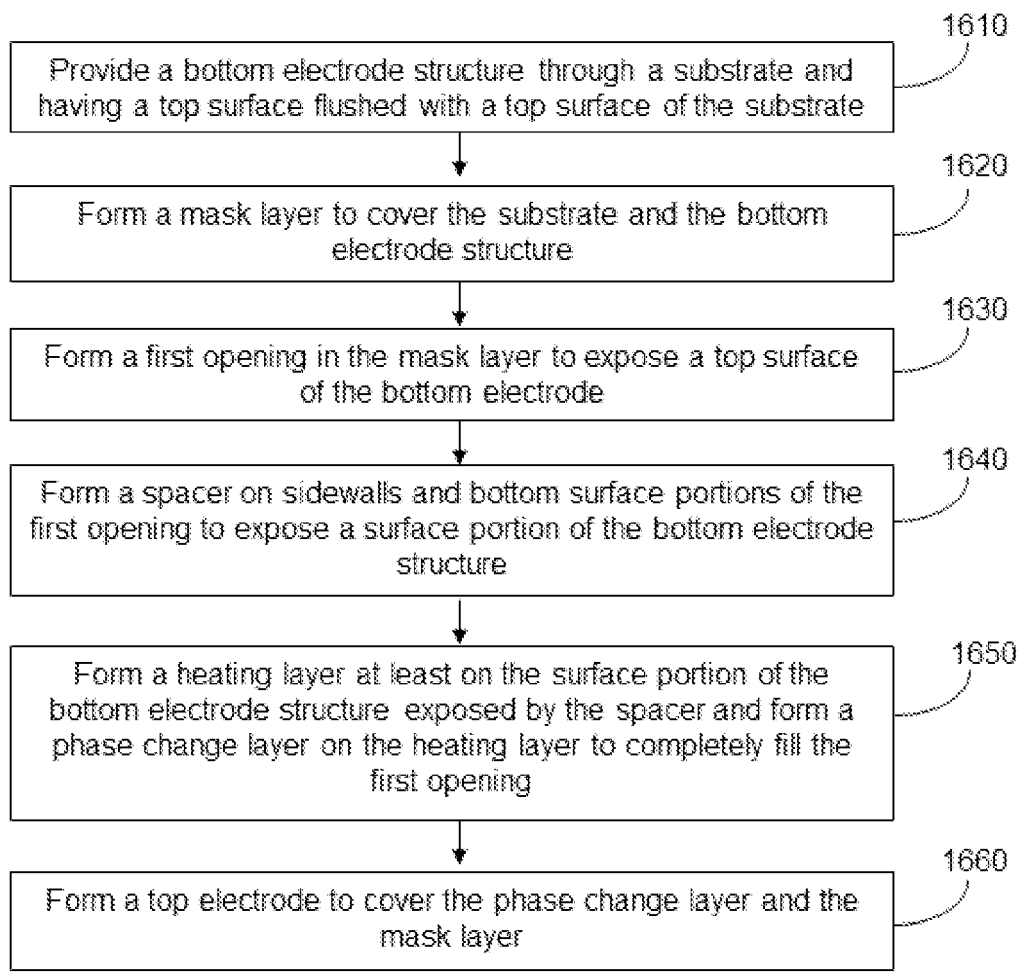
FIG. 16 depicts an exemplary method for forming a phase change memory in accordance with various disclosed embodiments.

FIGS. 2-15 are schematics illustrating an exemplary phase change memory at various stages during formation; and FIG. 16 depicts an exemplary method for forming a phase change memory in accordance with various disclosed embodiments.

Figure 2:
FIGS. 2-15 are schematics illustrating an exemplary phase change memory at various stages during formation in accordance with various disclosed embodiments.

Referring to FIG. 2, a substrate 100 is provided containing a bottom electrode structure 101 through the substrate 100. The surface of the bottom electrode structure 101 is flushed with the surface of the substrate 100 on both ends such as a top end and a bottom end. (e.g., Step 1610 of FIG. 16).

The substrate 100 can be made of dielectric materials. In an exemplary embodiment, the substrate 100 can be made of silicon oxide. In other embodiments, the substrate 100 can be made of SiOC, SiON, SiC, etc. The substrate 100 can be a dielectric layer formed on a semiconductor substrate. The semiconductor substrate can contain, e.g., transistors, to control a subsequently formed PCM.

The bottom electrode structure 101 in the substrate 100 can include a bottom electrode metal layer 112 formed through the substrate 100 and a bottom electrode adhesive layer 111 located between the bottom electrode metal layer 112 and the substrate 100. In one embodiment, the bottom electrode metal layer 112 can be made of W, and the bottom electrode adhesive layer 111 can be made of metal materials including, e.g., TiN, Ti, Ta, TaN, etc. The bottom electrode adhesive layer 111 can bond the bottom electrode metal layer 112 to the substrate 100 to avoid undesired occurrence of, e.g., leakage current caused by voids.

In an exemplary embodiment, the substrate 100 can also contain a peripheral metal interconnect structure 102 formed through the substrate 100. The surface of the peripheral metal interconnect structure 102 is flushed with the surface of the substrate 100 on both ends. The peripheral interconnect structure 102 can connect to devices (e.g., transistors) in other regions of the substrate 100. The peripheral interconnect structure 102 can include a peripheral metal layer 122 and a peripheral metal adhesive layer 121 positioned between the peripheral metal layer 122 and the substrate 100. In one embodiment, the peripheral metal layer 122 can be made of W, and the peripheral metal adhesive layer 121 can be made of metal materials including, e.g., TiN, Ti, Ta, TaN, etc. The peripheral metal adhesive layer 121 can bond the peripheral metal layer 122 to the substrate 100 to avoid undesired occurrence of, e.g., leakage current caused by voids.

Figure 3:
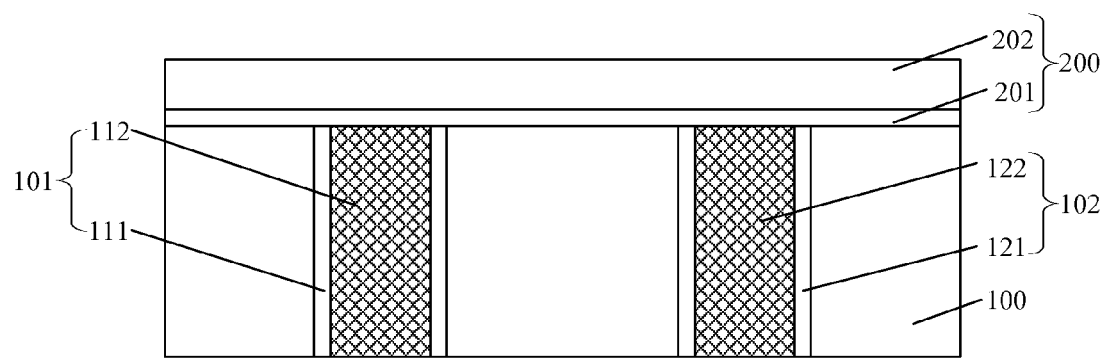

Referring to FIG. 3, a mask layer 200 can be formed to cover the substrate 100, the bottom electrode structure 101, and the peripheral metal interconnect structure 102 (e.g., Step 1620 of FIG. 16). The mask layer 200 can include a silicon nitride layer 201 and a silicon oxide layer 202 formed on the surface of the silicon nitride layer 201. The silicon nitride layer 201 can be an etch stop layer for a subsequently etching of the mask layer 200. In one embodiment, a chemical vapor deposition (CVD) process can be employed to form the mask layer 200. A heating layer and a phase change layer can be formed subsequently in the mask layer 200.

Figure 4:
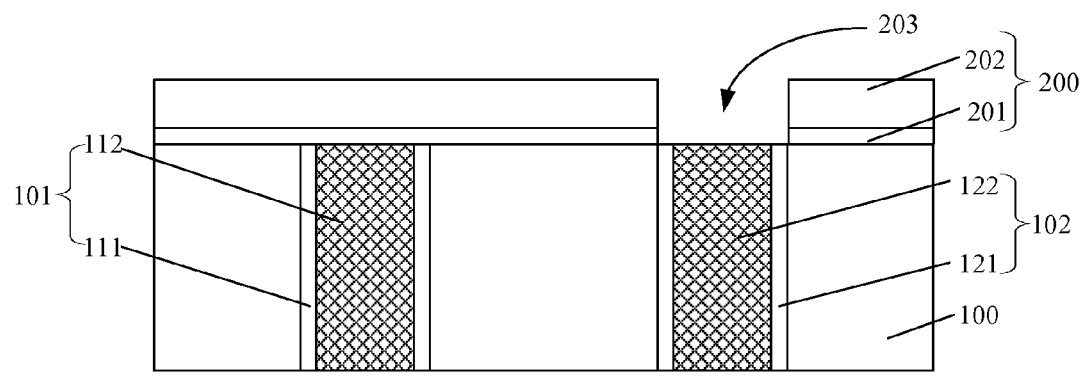

Referring to FIG. 4, a second opening 203 is formed in the mask layer 200 to expose an entire surface of the peripheral metal interconnect structure 102. The second opening 203 is on the surface of the peripheral metal interconnect structure 102.

A method for forming the second opening 203 can include: for example, forming a photoresist layer on surface of the mask layer 200. The photoresist layer is exposed and developed to form a patterned photoresist layer. The mask layer 200 can then be etched using the patterned photoresist layer as an etch mask to form the second opening 203. A metal layer can be formed subsequently in the second opening 203 to connect to the peripheral metal interconnect structure 102.

Figure 5:
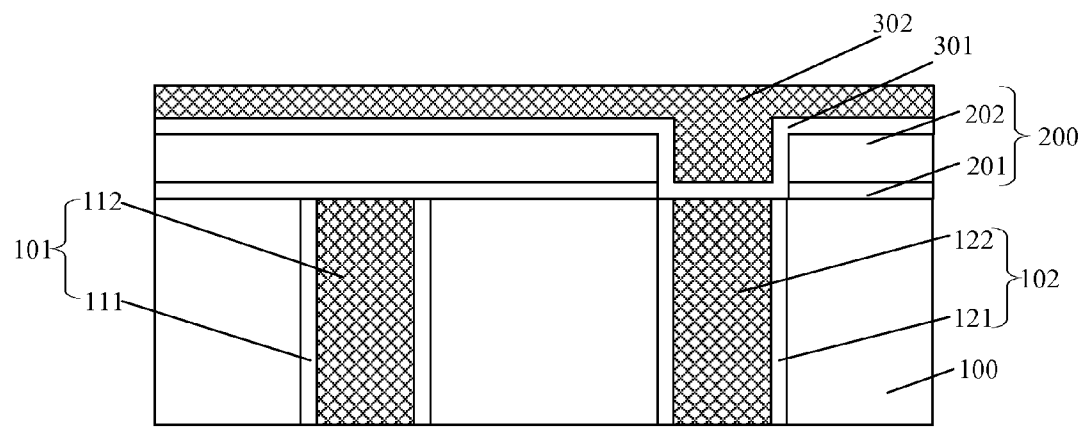

Referring to FIG. 5, a metal adhesive material layer 301 is formed on the inner walls of the second opening 203 (referring to FIG. 4) and on the surface of the mask layer 200. A metal material layer 302 is formed on the surface of the metal adhesive material layer 301 and completely fills the second opening 203 (referring to FIG. 4).

The metal adhesive material layer 301 is made of metal materials including, e.g., TiN, Ti, Ta, TaN, etc. The metal adhesive material layer 301 can be formed using an atomic layer deposition process, a chemical vapor deposition process, or a physical vapor deposition process. In an exemplary embodiment, the metal adhesive material layer 301 is made of TiN. The metal adhesive material layer 301 is formed by an atomic layer deposition process. For example, a temperature for the atomic layer deposition process can range from about 200° C. to about 400° C. Reactive gases are employed including a first precursor gas that contains titanium. Exemplary titanium-containing precursor gas can include Ti[N(C$_2$H$_5$CH$_3$)]$_4$, Ti[N(CH$_3$)$_2$]$_4$, Ti[N(C$_2$H$_5$)$_2$]$_4$, and/or a combination thereof. The reactive gases can also include a second precursor gas. Exemplary second precursor gas can include NH$_3$, CO, H$_2$O, and/or a combination thereof. In one embodiment, the metal material layer 302 is made of W. The metal material layer 302 can be formed using an electroplating process or a deposition process.

Figure 6:
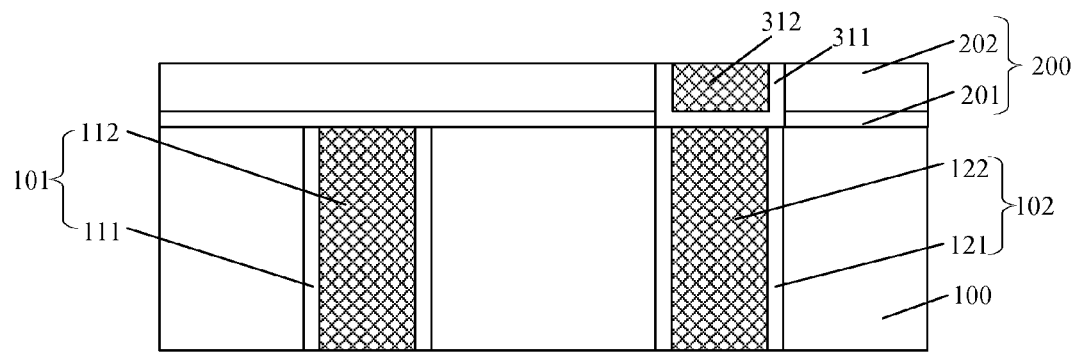

Referring to FIG. 6, planarization is performed to the metal material layer 302 and the metal adhesive material layer 301 (referring to FIG. 5) using the surface of the mask layer 200 as a stop layer. A metal adhesive layer 311 is remained on the surface of the peripheral metal interconnect structure 102 and on the inner walls of the second opening 203. A metal layer 312 is also remained on the surface of the metal adhesive layer 311 and completely fills the second opening 203 (referring to FIG. 4). The surface of the metal layer 312 is flushed with the surface of the mask layer 200 (in particular the layer 202 of the mask layer 200). In one embodiment, a chemical mechanical polishing process can be employed to planarize the metal material layer 302 and the metal adhesive material layer 301.

In an exemplary embodiment, during formation of the metal layer 312 above the peripheral metal interconnect structure 102, morphology of the formed second opening 203 can be desirably controlled. This may be because the mask layer 200 that needs to be etched has a thin thickness and simply-structured material layers for forming the second opening 203. Further, since the formed second opening 203 (referring to FIG. 4) has a shallow depth, difficulty of filling the metal material can be reduced when filling the second opening 203 with the metal material. Thus, quality of the formed metal layer can be improved.

Figure 7:
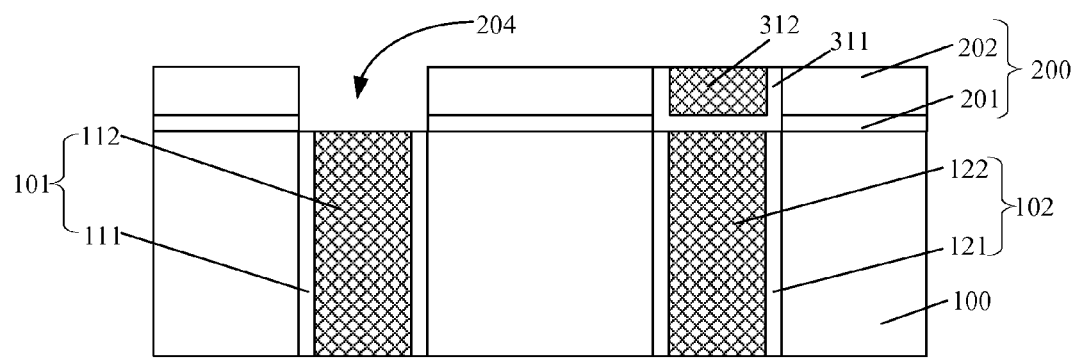

Referring to FIG. 7, a first opening 204 is formed in the mask layer 200 to expose a top surface of the bottom electrode structure 101 (e.g. Step 1630 of FIG. 16). The first opening 204 is on the top surface of the bottom electrode structure 101. A method for forming the first opening 204 can include forming a photoresist layer on the surface of the mask layer 200. The photoresist layer is exposed and developed to form a patterned photoresist layer defining position and dimension of the first opening. The mask layer 200 is etched to form the first opening 204 using the patterned photoresist layer as an etch mask. The width of the first opening 204 is the same as the width of the bottom electrode structure 101. In other embodiments, the width of the first opening 204 can be slightly narrower than the width of the bottom electrode structure 101. Since the width of the first opening 204 is the same as the width of the bottom electrode structure 101, difficulty of etching for forming the first opening 204 can be reduced. If the width of the first opening 204 is much narrow, then difficulty of etching can be increased.

Figure 8:
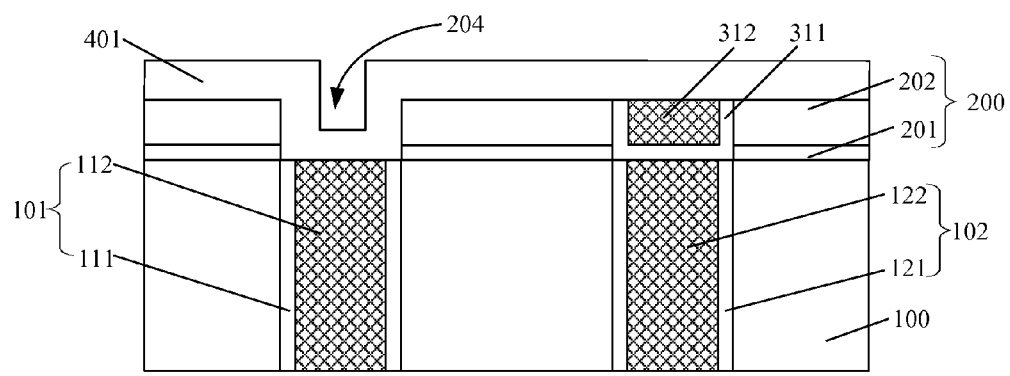

Referring to FIG. 8, a spacer material layer 401 is formed to conformally cover the mask layer 200, the metal layer 312, and the metal adhesive layer 311, as well as the inner walls of the first opening 204. For example, a chemical vapor deposition process can be used to form the spacer material layer 401. The spacer material layer 401 can be made of dielectric materials. In an exemplary embodiment, the spacer material layer 401 is made of silicon nitride.

The width of the first opening 204 is greater than twice the thickness of the spacer material layer 401. A spacer at least covering the sidewalls of the first opening 204 can thus be formed subsequently using a maskless etching process.

Figure 9:
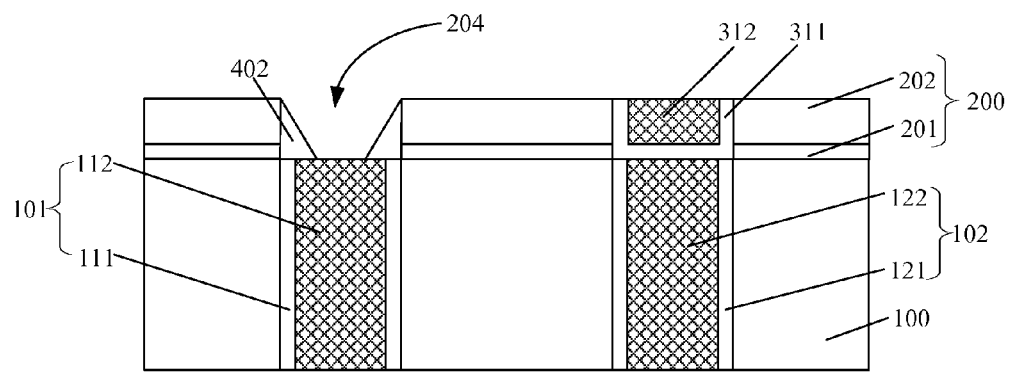

Referring to FIG. 9, a spacer 402 covering the inner sidewalls of the first opening 204 and exposing a top surface portion of the bottom electrode structure 101 is formed. A maskless etching process can be employed to etch the spacer material layer 401 (referring to FIG. 8) to remove portions of the spacer material layer that covers the mask layer 200, the metal layer 312, and the metal adhesive layer 311, as well as covers at least a portion of the bottom surface of the first opening 204, such that a spacer 402 is formed at least covering the inner sidewalls of the first opening 204 (e.g. Step 1640 of FIG. 16).

Since etching rate is higher at the top of the first opening 204, more the spacer material layer can be etched at the top portion to form the spacer 402. Accordingly, the spacer 402 formed on sidewall surfaces and on a bottom surface portion of the first opening 204 can provide the first opening 204 with a wide top and a narrow bottom. In other words, a distance between top portions of the spacer 402 is greater than a distance between bottom portions of the spacer 402 on the bottom electrode structure 101 and in the opening 204.

A top surface portion of the bottom electrode structure 101 is exposed at the bottom of the spacer 402, providing a reduced, exposed surface area of the bottom electrode. Thus, the contact area between a subsequently formed heating layer in the first opening 204 and the bottom electrode layer structure 101 is reduced, thereby reducing power consumption of a PCM. The distance between the bottom portions of the spacer 402 can range from about 10 nm to about 80 nm, which is smaller than the width of the underlying bottom electrode structure 101. The contact area between a subsequently formed heating layer and the bottom electrode structure 101 can be reduced.

Figure 10:
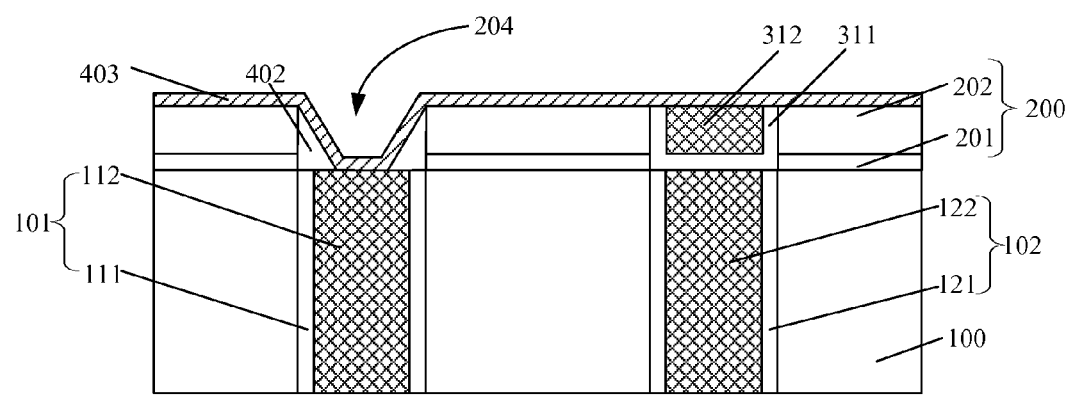

Referring to FIG. 10, a heating material layer 403 is formed covering the surface of the spacer 402 in the first opening 204, a surface portion of the bottom electrode layer structure 101, and the surfaces of the metal layer 312 and the metal adhesive layer 311. The heating material layer 403 can be made of metal materials having a high electrical conductivity and a low thermal conductivity. Such materials can include, e.g., TiN, Ti, TaN, Ta, etc. The thickness of the heating material layer 403 can be, e.g., less than 20 nm.

In an exemplary embodiment, the heating material layer 403 is made of TiN. The heating material layer 403 can be formed using a radio frequency physical vapor deposition process (RFPVD). For example, a RFPVD process can include a Ti target, Ar and $N_2$ gases that are introduced into a reaction chamber having a Ar-flow rate ranging from about 100 sccm to about 1000 sccm and having a $N_2$-flow rate ranging from about 50 sccm to about 500 sccm, a RF power ranging from about 30 W to about 500 W, a working pressure ranging from about 3E-4 Pa to about 4E-4 Pa, and a temperature ranging from about 20° C. to about 300° C. In other embodiments, other deposition processes can be employed to form the heating material layer 403.

Since the heating material layer 403 has a higher electrical conductivity, electrical connection between the bottom electrode structure 101 and the phase change layer subsequently formed on the surface of the heating material layer 403 cannot be affected. In addition, the low thermal conductivity of the heating material layer 403 is conducive to heat retention. This can slow down the transfer of heat generated by electric current in the phase change layer to the bottom electrode structure 101, thereby improving the thermal efficiency of a PCM. Further, the spacer 402 can cover only a surface portion of the bottom electrode structure 101, so that the contact area between the heating material layer 403 and the bottom electrode structure 101 becomes smaller. The power consumption caused by heat diffusion of a PCM can be further reduced to improve performance of PCM.

Figure 11:
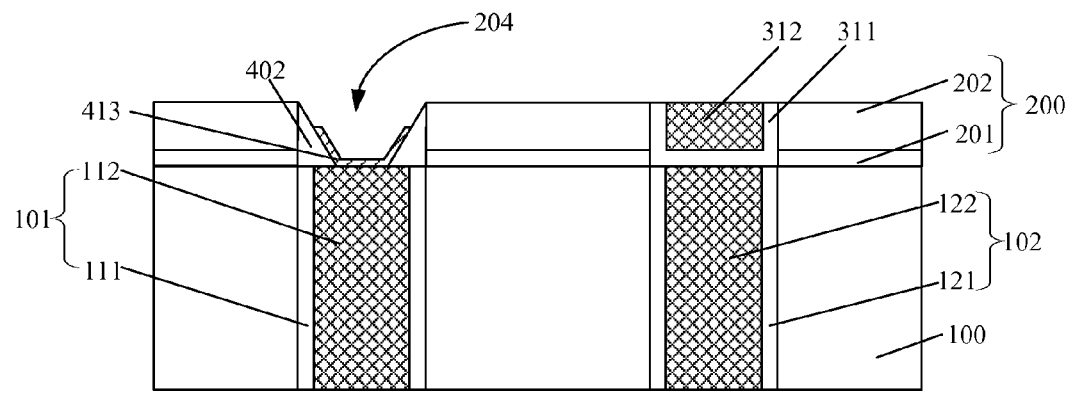

Referring to FIG. 11, the heating material layer 403 (referring to FIG. 10) is etched back to form a heating layer 413. The heating layer 413 covers the surface portion of the bottom electrode structure 101 at the bottom of the spacer 402, as well as a surface portion of the spacer 402 (e.g., Step 1650 of FIG. 16).

In one embodiment, a dry etching process is employed to etch back the heating material layer 403 to remove the heating material layer 403 covering the surfaces of the mask layer 200, the metal layer 312, and the metal adhesive layer 311, as well as an upper surface portion of the spacer 402. The etching gas can be fluorine-based gas (e.g., SF6, NF3, CF4, etc.). Since the surface of the mask layer 200 and the upper portion of the first opening 204 are exposed to the etching gas for a longer time than the bottom of the first opening 204, and the etching gas concentration is higher in such area including the surface of the mask layer 200 and the upper portion of the first opening 204, the etching rate of the heating material layer 403 on such area is greater than the etching rate of the heating material layer on the bottom surface of the first opening 204. As such, portions of the heating material layer on the bottom surface of the first opening 204 and on the lower surface portion of the spacer 402 is remained to form the heating layer 413 while the heating material layer 403 on the surfaces of the mask layer 200, the metal layer 312 and the metal adhesive layer 311 as well as on the upper surface portion of the spacer 402 is removed by the etching process.

In other embodiments, parameters of the etching process as well as the etching rate difference between materials at the top of the first opening 204 and at the bottom of the first opening 204 can be adjusted, such that the formed heating layer 413 can cover only the surface of the bottom electrode structure 101.

A top surface of the heating layer 413 formed by etching back the heating material layer is lower than the top surface of the mask layer 200, so that an electrical connection formed through contact between the heating layer 413 and a top electrode layer subsequently formed on the surface of the mask layer 200 can be avoided. Such electrical connection can electrically connect the bottom electrode 110 directly to the top electrode to affect the performance of a PCM.

Figure 12:
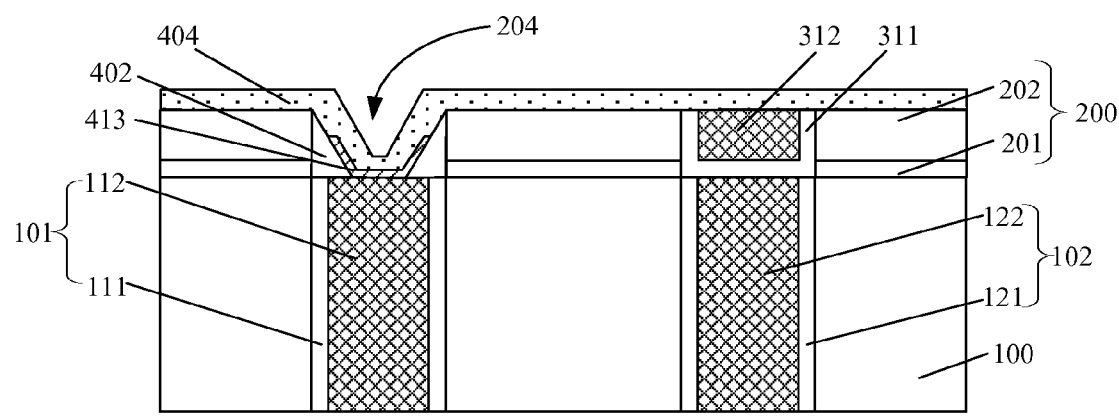

Referring to FIG. 12, a phase change material layer 404 is formed. The phase change material layer 404 can cover the heating layer 413, an exposed portion of the spacer 402 (uncovered by the heating layer), and surfaces of the mask layer 200, the metal layer 312, and the metal adhesive layer 311.

In an exemplary embodiment, in order to improve filling quality of the phase change material layer 404 in the opening 204, a deposition-etching-deposition process is employed to fill the first opening 204 with a phase change material.

For example, a chemical vapor deposition process can be used to deposit a thickness of phase change material on the surface of the heating layer 413 and in the opening 204. Etching the phase change material is then performed. Generally, filling the first opening 204 with the phase change material may close the first opening 204 at the top. Consequently, voids can be formed in the phase change material, which affects the deposition quality of the phase change material.

In an exemplary embodiment, after a thickness of phase change material is deposited on the surface of the heating layer 413 and in the first opening 204, etching the phase change material is performed to prevent closure of the top of the first opening 204. Thus, the subsequent deposition of the phase change material cannot be affected. Voids can be avoided during the formation.

Figure 13:
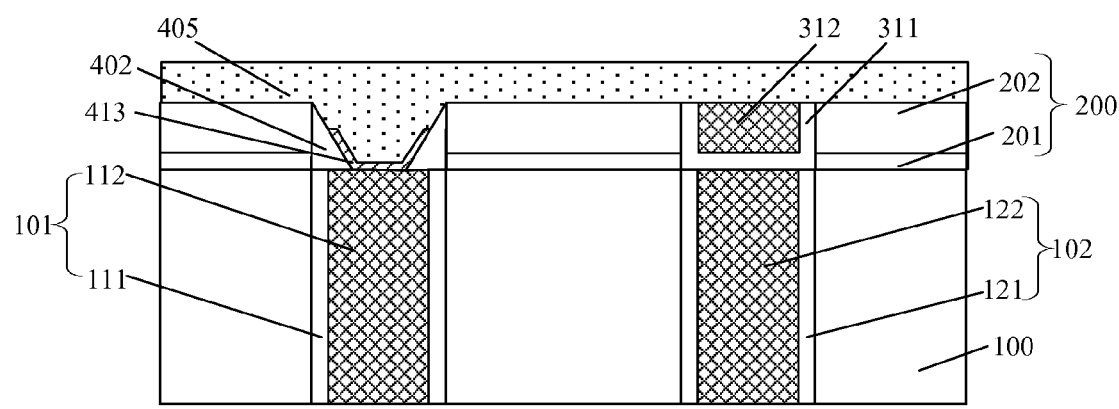

Referring to FIG. 13, deposition of the phase material is continued. A phase change material layer 405 is formed on the surfaces of the mask layer 200 and the heating layer 413. The phase change material layer 405 fills the first opening 204 completely (referring to FIG. 12). The phase change material layer 405 can be made of chalcogenides including, e.g., Si—Sb—Te, Ge—Sb—Te, Ag—In—Te, Ge—Bi—Te, or a combination thereof. The deposition process for forming the phase change material layer 405 can be a chemical vapor deposition process, an atomic layer deposition process, a low-pressure chemical vapor deposition process, or a plasma enhanced chemical vapor deposition process.

Figure 14:
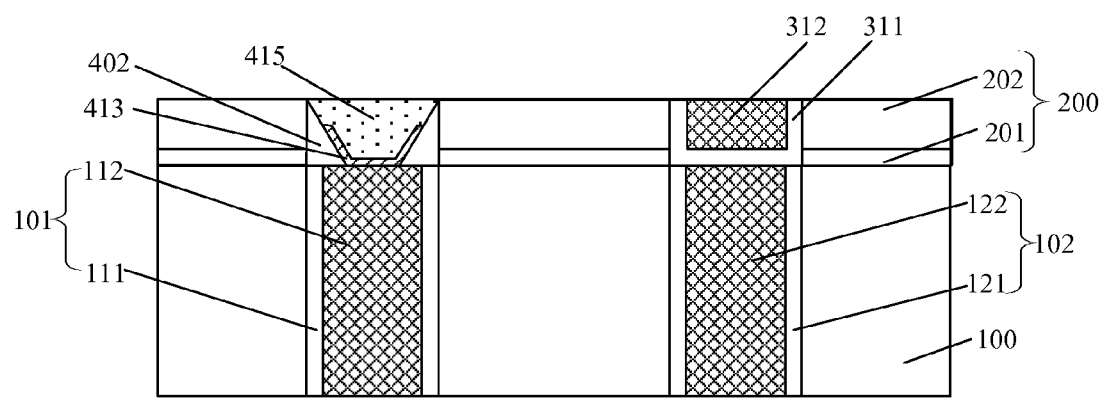

Referring to FIG. 14, the phase change material layer 405 (referring to FIG. 13) is planarized using the mask layer 200 as a stop layer to form a phase change layer 415. A chemical mechanical polishing process is used to planarize the phase change material layer 405 to form the phase change layer 415. The surface of the phase change layer 415 is flushed with the surface of the mask layer 200 (e.g., Step 1650 of FIG. 16).

Referring to FIG. 15, a top electrode 500 is formed. The top electrode 500 can cover the phase change layer 415, the mask layer 200, the metal layer 312 and the metal adhesive layer 311 (e.g. Step 1660 of FIG. 16). The top electrode 500 can be made of copper or aluminum. The top electrode 500 can be formed using a sputtering process or a chemical vapor deposition process.

Accordingly, referring to FIG. 15, the disclosure provides a phase change memory formed in accordance with various embodiments. The phase change memory can include a substrate 100, a bottom electrode structure 101 disposed in the substrate 100 and through the substrate 100, a mask layer 200 covering the substrate 100 and the bottom electrode structure 101, a first opening in the mask layer 200, a spacer 402 formed on the inner walls of the first opening and on surface portions of the bottom electrode structure 101, a heating layer 413 formed over the surface of the bottom electrode at the bottom of the spacer 402, a phase change layer 415 formed on the surface of the heating layer 413 in the first opening, and a top electrode 500 at least covering the phase change layer 415 and the mask layer 200.

A top surface of the bottom electrode structure 101 is flushed with a top surface of the substrate 100. The bottom of the first opening is at the top surface of the bottom electrode structure. A surface portion of a bottom electrode 112 is exposed at the bottom of the spacer 402. The first opening at the bottom of the spacer 402 has a width smaller than at the top of the spacer 402. The phase change layer 415 can completely fill the first opening.

The substrate 100 is made of dielectric materials. In an embodiment, the substrate 100 is made of silicon oxide. In other embodiments, the substrate 100 can be made of SiOC, SiON, SiC, and/or other dielectric materials.

The bottom electrode structure 101 can include a bottom electrode metal layer 112 and a bottom electrode adhesive layer 111. The bottom electrode adhesive layer is formed between the bottom electrode metal layer 112 and the substrate 100. The bottom electrode metal layer is made of W. The bottom electrode adhesive layer 111 can be made of metal materials, e.g., TiN, Ti, Ta, TaN, etc. The bottom electrode adhesive layer 111 can bond the bottom electrode metal layer 112 to the substrate 100, thereby preventing undesired occurrence of, e.g., leakage current caused by voids.

The mask layer 200 can include a silicon nitride layer 201 and a silicon oxide layer 202 formed on the surface of the silicon nitride layer 201.

In an exemplary embodiment, the substrate 100 can further include a peripheral metal interconnect structure 102. A top surface of the peripheral metal interconnect structure 102 is flushed with the top surface of the substrate 100. The peripheral metal interconnect structure 102 can include a peripheral metal layer 122 and a peripheral metal adhesive layer 121 formed between the peripheral metal layer 122 and the substrate 100.

In an exemplary embodiment, the PCM can further include a second opening in the mask layer 200, a metal layer 312 formed on the surface of the peripheral metal interconnect structure 102, and a metal adhesive layer 311 formed between the metal layer 312 and the mask layer 200. The bottom of the second opening 200 is at the surface of the peripheral metal interconnect structure 102. The metal layer 312 can completely fill the second opening. The top surface of the metal layer 312 is flushed with the top surface of the mask layer.

The bottom electrode can have a width at the bottom of the spacer 420 ranging from about 10 nm to about 80 nm. The heating layer 413 covers a surface portion of the spacer 402 from the bottom. The heating layer 413 has a thickness of less than about 20 nm. The heating layer 413 can be made of TiN, Ti, TaN, and/or Ta.

In this manner, a PCM fabricated by the disclosed method has a desired device performance. The heating layer 413 can retain heat, and can prevent the heat generated in the phase change layer from diffusing into the bottom electrode. Power consumption of a PCM is then reduced; heating efficiency of the phase change layer is improved; and reset energy of the PCM is reduced.

Other applications, advantages, alternations, modifications, or equivalents to the disclosed embodiments are obvious to those skilled in the art.

What is claimed is:

1. A method for fabricating a phase change memory, comprising:
   providing a substrate containing a bottom electrode structure through the substrate, the bottom electrode structure having a top surface flushed with a top surface of the substrate;
   forming a mask layer on the flushed top surfaces of the substrate and the bottom electrode structure;
   forming a first opening in the mask layer to expose the top surface of the bottom electrode structure;
   forming a spacer on sidewalls and bottom surface portions of the first opening to expose a surface portion of the bottom electrode structure, wherein the first opening including the spacer therein has a width at a bottom of the first opening less than a width at a top of the first opening;
   forming a heating layer at least on the surface portion of the bottom electrode structure exposed by the spacer, the heating layer having a top surface lower than a top surface of the mask layer;
   forming a phase change layer on the heating layer to completely fill the first opening, wherein the width at the bottom of the first opening to expose the bottom electrode structure by the spacer bottom ranges from about 10 nm to about 80 nm; and
   forming a top electrode on the phase change layer and the mask layer.

2. The method of claim 1, wherein the substrate further includes a peripheral metal interconnect structure disposed through the substrate and having a top surface flushed with the top surface of the substrate.

3. The method of claim 2, further including:
   forming a second opening in the mask layer prior to forming the first opening, the second opening exposing the top surface of the peripheral metal interconnect structure, and
   forming a metal layer on the peripheral metal interconnect structure and completely filling the second opening, the metal layer having a top surface flushed with the top surface of the mask layer.

4. The method of claim 1, wherein the phase change layer is made of chalcogenides.

5. The method of claim 1, wherein the phase change layer is made of Si—Sb—Te, Ge—Sb—Te, Ag—In—Te, Ge—Bi—Te, or a combination thereof.

6. The method of claim 1, wherein forming the spacer includes:
   forming a spacer material layer covering the sidewalls and the bottom of the first opening and covering the top surface of the mask layer, and
   etching the spacer material layer using a maskless etching process to remove a portion of the spacer material layer that covers the top surface of the mask layer and a portion of the bottom surface of the first opening to form the spacer covering the sidewalls and bottom surface portions of the first opening.

7. The method of claim 1, wherein the spacer is made of SiN.

8. The method of claim 1, wherein forming the heating layer includes:
   forming a heating material layer on the mask layer, on the spacer, and on the exposed surface portion of the bottom electrode structure, and etching back the heating material layer to remove a portion of the heating material layer that is on the mask layer and on a surface portion of the spacer to form the heating layer.

9. The method of claim 8, wherein forming the heating material layer includes a physical vapor deposition process.

10. The method of claim 8, wherein etching back the heating material layer includes a dry etching process.

11. A method for fabricating a phase change memory, comprising:
   providing a substrate containing a bottom electrode structure through the substrate, the bottom electrode structure having a top surface flushed with a top surface of the substrate;
   forming a mask layer on the flushed top surfaces of the substrate and the bottom electrode structure;
   forming a first opening in the mask layer to expose the top surface of the bottom electrode structure;
   forming a spacer on sidewalls and bottom surface portions of the first opening to expose a surface portion of the bottom electrode structure, wherein the first opening including the spacer therein has a width at a bottom of the first opening less than a width at a top of the first opening;
   forming a heating layer at least on the surface portion of the bottom electrode structure exposed by the spacer, the heating layer having a top surface lower than a top surface of the mask layer, wherein forming the heating layer includes:
      forming a heating material layer on the mask layer, on the spacer, and on the exposed surface portion of the bottom electrode structure, and etching back the heating material layer to remove a portion of the heating material layer that is on the mask layer and on a surface portion of the spacer to form the heating layer, wherein the heating material layer has a thickness of less than about 20 nm;
   forming a phase change layer on the heating layer to completely fill the first opening; and
   forming a top electrode on the phase change layer and the mask layer.

12. The method of claim 8, wherein the heating material layer is made of a material including TiN, Ti, TaN, Ta, or a combination thereof.

13. The method of claim 11, wherein the substrate further includes a peripheral metal interconnect structure disposed through the substrate and having a top surface flushed with the top surface of the substrate.

14. The method of claim 13, further including:
   forming a second opening in the mask layer prior to forming the first opening, the second opening exposing the top surface of the peripheral metal interconnect structure, and
   forming a metal layer on the peripheral metal interconnect structure and completely filling the second opening, the metal layer having a top surface flushed with the top surface of the mask layer.

15. The method of claim 11, wherein the phase change layer is made of chalcogenides.

16. The method of claim 11, wherein the phase change layer is made of Si—Sb—Te, Ge—Sb—Te, Ag—In—Te, Ge—Bi—Te, or a combination thereof.

17. The method of claim 11, wherein forming the heating material layer includes a physical vapor deposition process.

18. The method of claim 11, wherein etching back the heating material layer includes a dry etching process.

19. The method of claim 11, wherein the heating material layer is made of a material including TiN, Ti, TaN, Ta, or a combination thereof.

* * * * *